(12) United States Patent
Hwang (10) Patent No.: US 9,025,401 B2
(45) Date of Patent: May 5, 2015

(54) SEMICONDUCTOR MEMORY DEVICE INCLUDING BULK VOLTAGE GENERATION CIRCUIT

(71) Applicant: SK Hynix Inc., Icheon-si Gyeonggi-do (KR)

(72) Inventor: Mi Hyun Hwang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 62 days.

(21) Appl. No.: 13/963,614

(22) Filed: Aug. 9, 2013

(65) Prior Publication Data

US 2014/0219040 A1     Aug. 7, 2014

(30) Foreign Application Priority Data

Feb. 7, 2013   (KR) .................. 10-2013-0014157

(51) Int. Cl.
*G11C 7/00*    (2006.01)
*G11C 5/14*    (2006.01)

(52) U.S. Cl.
CPC ..................................... *G11C 5/148* (2013.01)

(58) Field of Classification Search
CPC .......... G11C 7/22; G11C 5/147; H01L 27/115
USPC .................... 365/194, 229, 189.09, 185.27
See application file for complete search history.

(56) References Cited

U.S. PATENT DOCUMENTS

2010/0182867 A1*   7/2010  Lee ................... 365/226
2012/0188831 A1    7/2012  Ito et al.

FOREIGN PATENT DOCUMENTS

KR           101053526 B1      7/2011

\* cited by examiner

*Primary Examiner* — Huan Hoang
(74) *Attorney, Agent, or Firm* — William Park & Associates Ltd.

(57) ABSTRACT

A semiconductor memory device includes a bulk voltage generation circuit configured to interrupt driving of a bulk voltage in response to an exit signal which is generated in synchronization with a time at which a power-down mode is ended, and discharge charges of a first node from which the bulk voltage is outputted, in response to the exit signal; and an internal circuit including a MOS transistor which is supplied with the bulk voltage.

21 Claims, 6 Drawing Sheets

SEMICONDUCTOR MEMORY DEVICE INCLUDING BULK VOLTAGE GENERATION CIRCUIT

CROSS-REFERENCES TO RELATED APPLICATIONS

The present application claims priority under 35 U.S.C 119(a) to Korean Patent Application No. 10-2013-0014157 filed on Feb. 7, 2013 in the Korean Intellectual Property Office, which is incorporated herein by reference in its entirety set forth in full.

BACKGROUND

1. Technical Field

Various embodiments relate generally to an electronic circuit and, more particularly, to a semiconductor memory device.

2. Related Art

An internal circuit included in a semiconductor memory device includes a plurality of PMOS transistors and a plurality of NMOS transistors. The semiconductor memory device is designed such that bulk voltages are applied to the bulk terminals of the PMOS transistors and the NMOS transistors. This is to prevent the occurrence of a latch-up phenomenon and prevent the threshold voltages of the MOS transistors from being unstably changed by a body effect.

In general, the levels of the bulk voltages applied to PMOS transistors and NMOS transistors exert influences on the leakage current of the PMOS transistors and the NMOS transistors which are in a turned-off state and on the operation speeds of the PMOS transistors and the NMOS transistors which are in a turned-on state. That is to say, in the case of an NMOS transistor, as a bulk voltage with a level lower than the voltage of a source terminal is applied, the amount of leakage current and an operation speed are decreased. Further, in the case of a PMOS transistor, as a bulk voltage with a level higher than the voltage of a source terminal is applied, the amount of leakage current and an operation speed are decreased.

Additionally, a semiconductor memory device has a power-down mode as one of standby modes. The power-down mode is an operation mode in which, although power is applied, the generation of an internal clock is interrupted to reduce power consumption. In the power-down mode, it is important that the amount of leakage current is limited to a minimum to reduce power consumption. Therefore, in the power-down mode, it is advantageous in terms of reduction of power consumption to set lower the level of the bulk voltage of an NMOS transistor and set higher the level of the bulk voltage of a PMOS transistor.

SUMMARY

An embodiment of the present invention relates to a semiconductor memory device including a bulk voltage generation circuit which can prevent the occurrence of a misoperation upon end of a power-down mode.

In an embodiment, a semiconductor memory device includes: a bulk voltage generation circuit configured to interrupt driving of a bulk voltage in response to an exit signal which is generated in synchronization with a time at which a power-down mode is ended, and discharge charges of a first node from which the bulk voltage is outputted, in response to the exit signal; and an internal circuit including a MOS transistor which is supplied with the bulk voltage.

In an embodiment, a semiconductor memory device includes: an exit signal generation unit configured to generate an exit signal which includes a pulse with a preset pulse width, from a time in which a power-down mode is ended; a voltage driving control unit configured to drive a bulk voltage to be supplied to a MOS transistor included in an internal circuit, with an external voltage or an internal voltage in response to the exit signal and a clock enable signal; and a level control unit configured to discharge charges of a first node or supply charges to the first node and control a level of the first node, in response to the exit signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
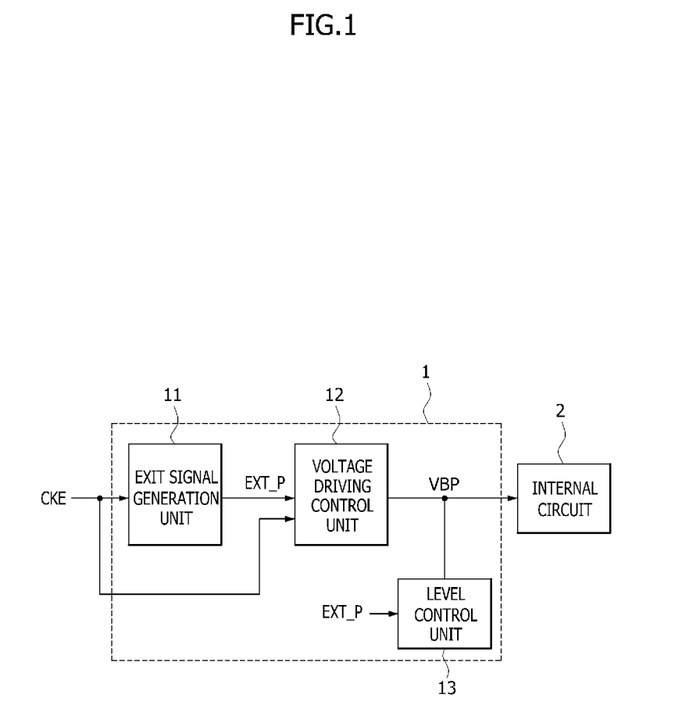
FIG. 1 is a block diagram showing the configuration of a semiconductor memory device in accordance with an embodiment of the present invention.

FIG. 1 is a block diagram showing the configuration of a semiconductor memory device in accordance with an embodiment of the present invention.

Referring to FIG. 1, a semiconductor memory device in accordance with an embodiment of the present invention may include a bulk voltage generation circuit 1 and an internal circuit 2. The bulk voltage generation circuit 1 may be constituted by an exit signal generation unit 11, a voltage driving control unit 12, and a level control unit 13. The exit signal generation unit 11 may be configured to generate an exit signal EXT_P which may include a pulse with a preset pulse width, from a time at which a power-down mode is ended, in response to a clock enable signal CKE. The voltage driving control unit 12 may be configured to drive a bulk voltage VBP in response to the clock enable signal CKE and the exit signal EXT_P. The level control unit 13 may be configured to control the level of the bulk voltage VBP in response to the exit signal EXT_P. The internal circuit 2 may include a MOS transistor (not shown) which is supplied with the bulk voltage VBP and is controlled by its threshold voltage. The clock enable signal CKE is a signal which is disabled to a logic low level in the power-down mode to prevent an internal clock from being generated.

Figure 2:
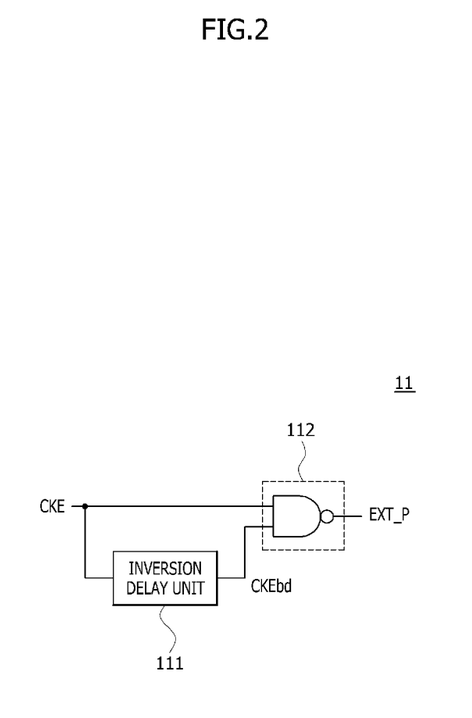
FIG. 2 is a diagram showing an example of an embodiment of the exit signal generation unit included in the semiconductor memory device shown in FIG. 1.

Referring to FIG. 2, the exit signal generation unit 11 may include an inversion delay unit 111 and a logic section 112. The inversion delay unit 111 may be configured to inversion-delay the clock enable signal CKE and output an inversion-delayed clock enable signal CKEbd. The logic section 112 may be configured to receive the clock enable signal CKE and the output signal of the inversion delay unit 111, perform a NAND operation and generate the exit signal EXT_P. The exit signal generation unit 11 configured in this way generates the exit signal EXT_P which may include a pulse with a pulse width corresponding to the delay period of the inversion delay unit 111, from the time at which the power-down mode is ended.

Figure 3:
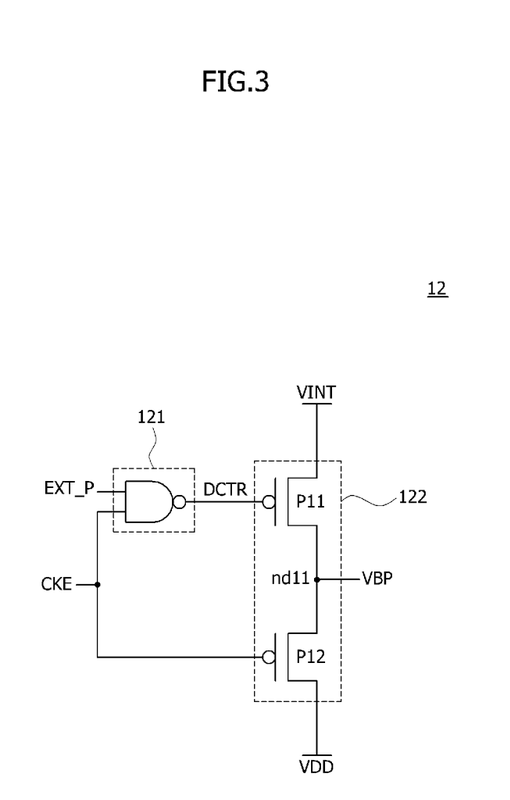
FIG. 3 is a diagram showing an example of an embodiment of the voltage driving control unit included in the semiconductor memory device shown in FIG. 1.

Referring to FIG. 3, the voltage driving control unit 12 may include a driving control signal generating section 121 and a driving section 122. The driving control signal generating section 121 may be configured to generate a driving control signal DCTR disabled to a logic high level during a period in which the clock enable signal CKE is disabled to the logic low level, that is, during the period of the power-down mode and a period in which the pulse of the exit signal EXT_P is generated. The driving section 122 may be constituted by a PMOS transistor P11 configured to drive a node nd11 from which the bulk voltage VBP is outputted, with an internal voltage VINT in the case where the driving control signal DCTR is enabled to a logic low level, and a PMOS transistor P12 configured to drive the node nd11 with an external voltage VDD during the period of the power-down mode.

The voltage driving control unit 12 configured in this way may drive the bulk voltage VBP with the internal voltage VINT before entry into the power-down mode, and may drive the bulk voltage VBP with the external voltage VDD during the power-down mode and the period in which the pulse of the exit signal EXT_P is generated. Moreover, the voltage driving control unit 12 may interrupt the driving of the bulk voltage VBP when the power-down mode is ended and during the period in which the pulse of the exit signal EXT_P is generated, and may drive the bulk voltage VBP again with the internal voltage VINT after the period in which the pulse of the exit signal EXT_P is generated lapses.

Figure 4:
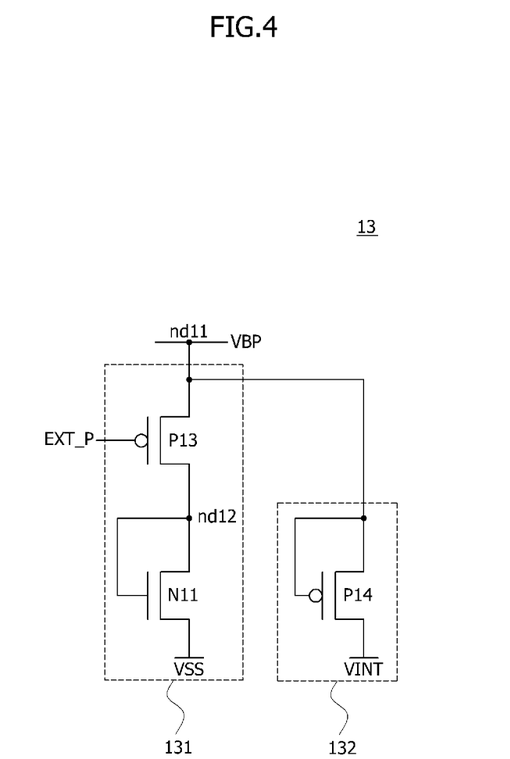
FIG. 4 is a diagram showing an example of an embodiment of the level control unit included in the semiconductor memory device shown in FIG. 1.

Referring to FIG. 4, the level control unit 13 may be constituted by a charge discharge section 131 and a charge supply section 132. The charge discharge section 131 may be constituted by a PMOS transistor P13 which is connected between the node nd11 from which the bulk voltage VBP is outputted and a node nd12 and operates as a switch element which is tuned on in response to the exit signal EXT_P, and an NMOS transistor N11 which is connected between the node nd12 and a ground voltage VSS and operates as a diode element which discharges charges. The charge supply section 132 may be constituted by a PMOS transistor P14 which is connected between the node nd11 and the internal voltage VINT and operates as a diode element which supplies charges.

The level control unit 13 configured in this way may discharge the charges of the node nd11 from which the bulk voltage VBP is outputted, through the NMOS transistor N11 which operates as a diode element, after the power-down mode is ended and during the period in which the pulse of the exit signal EXT_P is generated. At this time, in the case where the bulk voltage VBP has a level lower than the internal voltage VINT, the PMOS transistor P14 is turned on, operates as a diode element, and supplies charges to the node nd11. In other words, the level control unit 13 may lower the level of the bulk voltage VBP to a state in which the level of the bulk voltage VBP is higher than the internal voltage VINT, when the power-down mode is ended.

Figure 5:
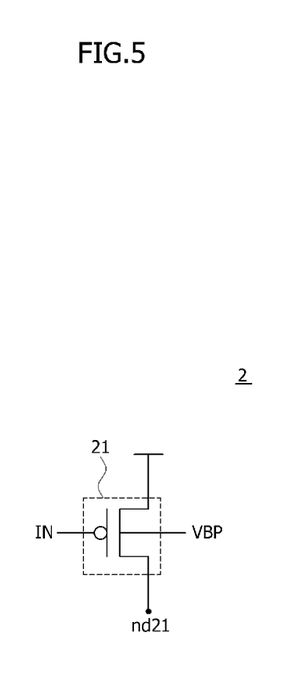
FIG. 5 is a diagram showing an example of an embodiment of the internal circuit included in the semiconductor memory device shown in FIG. 1.

Referring to FIG. 5, the internal circuit 2 may include a PMOS transistor 21 which is connected between a power source and a node nd21 and receives an input signal IN through the gate thereof and may be supplied with the bulk voltage VBP through the bulk terminal thereof to be controlled by its threshold voltage. A plurality of MOS transistors which are configured in the same way as the PMOS transistor 21 may be included in the internal circuit 2, and the input signal IN may be various signals which are used in the internal circuit 2.

Figure 6:
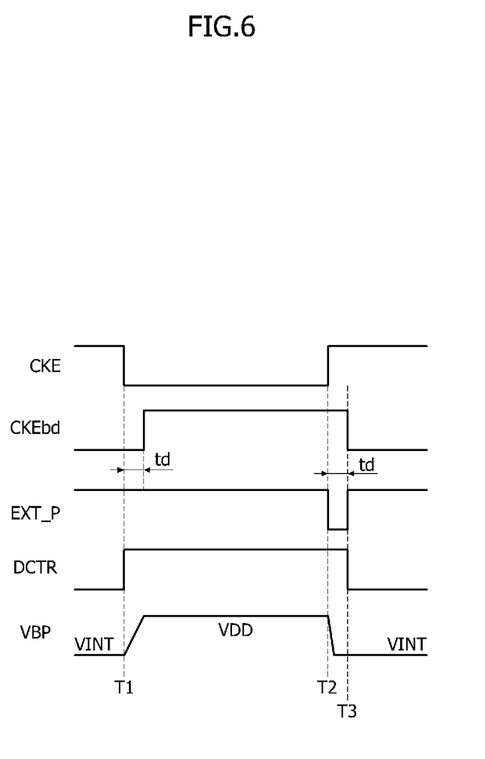
FIG. 6 is a timing diagram explaining operations of the semiconductor memory device shown in FIG. 1 before and after entry into a power-down mode.

Operations of the semiconductor memory device configured as mentioned above will be described below in detail with reference to FIG. 6.

First, in a period before a time T1 at which the power-down mode is entered, the clock enable signal CKE is enabled to a logic high level. Since the exit signal EXT_P has a logic high level, the driving control signal DCTR is enabled to the logic low level. Accordingly, the bulk voltage VBP is driven with the internal voltage VINT. The inversion-delayed clock enable signal CKEbd is also illustrated in FIG. 6 as shown.

Next, during the period of the power-down mode, that is, during a period from T1 to T2, the clock enable signal CKE is disabled to the logic low level. Since the exit signal EXT_P has the logic high level, the driving control signal DCTR is disabled to the logic high level, and the bulk voltage VBP is driven with the external voltage VDD.

When the power-down mode is ended and during the period in which the pulse of the exit signal EXT_P is generated, that is, during a period from T2 to T3 corresponding to td, and the driving control signal DCTR is disabled to the logic high level, the driving of the bulk voltage VBP is interrupted. At this time, the level of the bulk voltage VBP decreases in the state in which the level of the bulk voltage VBP is retained to be higher than the internal voltage VINT, through the level control unit 13 (see FIG. 4).

Finally, after T3 at which the pulse generation period of the exit signal EXT_P is ended, since the clock enable signal CKE is enabled to the logic high level, the driving control signal DCTR is enabled to the logic low level. Accordingly, the bulk voltage VBP is driven with the internal voltage VINT.

In the above-described semiconductor memory device according to the embodiments of the present invention, the driving of the bulk voltage VBP is interrupted at the time in which the power-down mode is ended. In the case where the driving of the bulk voltage VBP is interrupted, a phenomenon does not occur, in which the bulk voltage VBP and the internal voltage VINT are shorted with each other. As a consequence, it is possible to prevent the occurrence of a phenomenon in which the level of the internal voltage VINT is raised by the bulk voltage VBP. Because the level of the internal voltage VINT is prevented from being raised at the time in which the power-down mode is ended, it is possible to prevent the occurrence of a phenomenon in which the timing of a signal driven by the internal voltage VINT is changed, thereby causing a misoperation.

According to the embodiments of the present invention, it is possible to prevent the occurrence of a phenomenon in which a bulk voltage and an internal voltage are shorted at a time in which a power-up period is ended and thus the level of the internal voltage rises.

Also, according to the embodiments of the present invention, it is possible to prevent the occurrence of a phenomenon in which the level of the internal voltage rises during a period in which the power-up period is ended and the timing of a signal driven by the internal voltage is changed, thereby causing a misoperation.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
a bulk voltage generation circuit configured to interrupt driving of a bulk voltage in response to an exit signal which is generated in synchronization with a time at which a power-down mode is ended, and discharge charges of a first node from which the bulk voltage is outputted, in response to the exit signal; and
an internal circuit including a MOS transistor which is supplied with the bulk voltage wherein the bulk voltage generation circuit drives the bulk voltage with an internal voltage before the power-down mode is entered, and drives the bulk voltage with an external voltage in the power-down mode.

2. The semiconductor memory device according to claim 1, wherein the bulk voltage generation circuit comprises:
a voltage driving control unit configured to drive the bulk voltage with the external voltage or the internal voltage in response to the exit signal which includes a pulse with a preset pulse width and a clock enable signal, from the time at which the power-down mode is ended; and
a level control unit configured to discharge charges of the first node or supply charges to the first node and control a level of the first node, in response to the exit signal.

3. The semiconductor memory device according to claim 2, wherein the clock enable signal is disabled in the case where the power-down mode is entered, to interrupt generation of an internal clock.

4. The semiconductor memory device according to claim 3, wherein the voltage driving control unit drives the bulk voltage with the internal voltage during a period in which the clock enable signal is disabled and a period in which a pulse included in the exit signal is generated.

5. The semiconductor memory device according to claim 4, wherein the voltage driving control unit comprises:
a driving control signal generating section configured to generate a driving control signal in response to the clock enable signal and the exit signal; and
a driving section configured to drive the bulk voltage with the external voltage or the internal voltage in response to the driving control signal and the clock enable signal.

6. The semiconductor memory device according to claim 5, wherein the driving control signal is disabled during the period in which the clock enable signal is disabled and the period in which a pulse included in the exit signal is generated.

7. The semiconductor memory device according to claim 6, wherein the driving section drives the bulk voltage with the internal voltage during a period in which the driving control signal is enabled, and drives the bulk voltage with the external voltage during the period in which the clock enable signal is disabled.

8. The semiconductor memory device according to claim 2, wherein the level control unit comprises:
a charge discharging section configured to discharge charges of the first node in response to the exit signal; and
a charge supply section configured to supply charges to the first node from the internal voltage according to the level of the first node.

9. The semiconductor memory device according to claim 8, wherein the charge discharging section comprises:
a switch element connected between the first node and a second node and turned on in response to the exit signal; and
a diode element connected between the second node and a ground voltage.

10. The semiconductor memory device according to claim 8, wherein the charge supply section comprises a diode element which is connected between the first node and the internal voltage and supplies charges to the first node in the case where a voltage of the first node has a level lower than the internal voltage.

11. The semiconductor memory device according to claim 3, wherein the bulk voltage generation circuit further comprises:
an exit signal generation unit configured to generate the exit signal in response to the clock enable signal.

12. The semiconductor memory device according to claim 11, wherein the exit signal generation unit comprises:
an inversion-delay unit configured to inversion-delay the clock enable signal; and
a logic section configured to generate the exit signal in response to an output signal of the inversion-delay unit and the clock enable signal.

13. A semiconductor memory device comprising:
an exit signal generation unit configured to generate an exit signal which includes a pulse with a preset pulse width, from a time in which a power-down mode is ended;
a voltage driving control unit configured to drive a bulk voltage to be supplied to a MOS transistor included in an internal circuit, with an external voltage or an internal voltage in response to the exit signal and a clock enable signal; and
a level control unit configured to discharge charges of a first node or supply charges to the first node and control a level of the first node, in response to the exit signal, wherein the clock enable signal is disabled in the case where the power-down mode is entered, to interrupt generation of an internal clock.

14. The semiconductor memory device according to claim 13, wherein the voltage driving control unit drives the bulk voltage with the internal voltage during a period in which the clock enable signal is disabled and a period in which a pulse included in the exit signal is generated.

15. The semiconductor memory device according to claim 14, wherein the voltage driving control unit comprises:
a driving control signal generating section configured to generate a driving control signal in response to the clock enable signal and the exit signal; and
a driving section configured to drive the bulk voltage with the external voltage or the internal voltage in response to the driving control signal and the clock enable signal.

16. The semiconductor memory device according to claim 15, wherein the driving control signal is disabled during the period in which the clock enable signal is disabled and the period in which a pulse included in the exit signal is generated.

17. The semiconductor memory device according to claim 16, wherein the driving section drives the bulk voltage with the internal voltage during a period in which the driving control signal is enabled, and drives the bulk voltage with the external voltage during the period in which the clock enable signal is disabled.

18. The semiconductor memory device according to claim 13, wherein the level control unit comprises:

a charge discharging section configured to discharge charges of the first node in response to the exit signal; and a charge supply section configured to supply charges to the first node from the internal voltage according to the level of the first node.

19. The semiconductor memory device according to claim 18, wherein the charge discharging section comprises:

a switch element connected between the first node and a second node and turned on in response to the exit signal; and a diode element connected between the second node and a ground voltage.

20. The semiconductor memory device according to claim 18, wherein the charge supply section comprises a diode element which is connected between the first node and the internal voltage and supplies charges to the first node in the case where a voltage of the first node has a level lower than the internal voltage.

21. The semiconductor memory device according to claim 13, wherein the exit signal generation unit comprises:

an inversion-delay unit configured to inversion-delay the clock enable signal; and a logic section configured to generate the exit signal in response to an output signal of the inversion-delay unit and the clock enable signal.

* * * * *